US011017706B2

(12) United States Patent
Lu

(10) Patent No.: US 11,017,706 B2
(45) Date of Patent: May 25, 2021

(54) DISPLAY SCREEN AND ELECTRONIC DEVICE

(71) Applicant: GUANGDONG OPPO MOBILE TELECOMMUNICATIONS CORP., LTD., Guangdong (CN)

(72) Inventor: Jianqiang Lu, Guangdong (CN)

(73) Assignee: GUANGDONG OPPO MOBILE TELECOMMUNICATIONS CORP., LTD., Guangdong (CN)

(*) Notice: Subject to any disclaimer, the term of this patent is extended or adjusted under 35 U.S.C. 154(b) by 24 days.

(21) Appl. No.: 16/525,341

(22) Filed: Jul. 29, 2019

(65) Prior Publication Data
US 2020/0043397 A1 Feb. 6, 2020

(30) Foreign Application Priority Data

Aug. 3, 2018 (CN) .......................... 201810878085.1

(51) Int. Cl.
*G09G 3/20* (2006.01)
*G09G 3/36* (2006.01)
*G09G 3/32* (2016.01)

(52) U.S. Cl.
CPC ......... *G09G 3/2003* (2013.01); *G09G 3/3607* (2013.01); *G09G 3/32* (2013.01); *G09G 2300/0439* (2013.01)

(58) Field of Classification Search
CPC ...... G09G 3/2003; G09G 3/3607; G09G 3/32; G09G 2300/0439; G09G 5/00;
(Continued)

(56) References Cited

U.S. PATENT DOCUMENTS 7,714,923 B2 * 5/2010 Cok ....................... H04N 7/144
348/333.01
8,773,573 B1 * 7/2014 Saeedi ................. H04N 5/2254
348/340
(Continued)

FOREIGN PATENT DOCUMENTS

CN   106710524 A   5/2017
CN   107135341 A   9/2017
(Continued)

OTHER PUBLICATIONS

Partial search report, EP19189531.7, dated Oct. 25, 2019.
(Continued)

*Primary Examiner* — Amy Onyekaba
(74) *Attorney, Agent, or Firm* — Perkins Coie LLP

(57) ABSTRACT

A display screen and an electronic device are provided. The display screen includes a number of display pixels arranged on a display area of the display screen and a plurality of image capturing pixels arranged in gaps between the plurality of display pixels. The display screen is operable in a display mode or an image capturing mode. The plurality of display pixels is switched on when the display screen is in the display mode and the plurality of image capturing pixels is switched on when the display screen is in the image capturing mode. The display screen integrates display pixels and image capturing pixels, so the display screen may be used for display and image capturing at the same time.

18 Claims, 7 Drawing Sheets

(58) Field of Classification Search
CPC ...... G09G 2360/14; G09G 2300/0452; H04M 1/026; H04M 1/0266

See application file for complete search history.

(56) References Cited

U.S. PATENT DOCUMENTS

| | | | | |
|---|---|---|---|---|
| 9,055,187 | B1* | 6/2015 | Maeng | H04N 7/144 |
| 9,608,727 | B2* | 3/2017 | Aoyama | H04L 1/0072 |
| 10,490,148 | B2* | 11/2019 | Wang | G06T 11/60 |
| 2005/0200293 | A1* | 9/2005 | Naugler, Jr. | H01L 27/3227 315/149 |
| 2007/0216637 | A1* | 9/2007 | Ito | G06F 3/0412 345/102 |
| 2008/0106591 | A1* | 5/2008 | Border | H04N 7/144 348/14.01 |
| 2008/0106628 | A1* | 5/2008 | Cok | H04N 7/144 348/333.01 |
| 2008/0106629 | A1* | 5/2008 | Kurtz | H04N 7/144 348/333.01 |
| 2008/0144967 | A1* | 6/2008 | Struyk | G09G 3/20 382/276 |
| 2008/0165267 | A1* | 7/2008 | Cok | H04N 7/144 348/333.01 |
| 2009/0009451 | A1* | 1/2009 | Hamagishi | G02B 30/27 345/87 |
| 2010/0066800 | A1* | 3/2010 | Ryf | H04N 7/144 348/14.01 |
| 2012/0001878 | A1* | 1/2012 | Kurokawa | G09G 3/3688 345/204 |
| 2012/0280987 | A1* | 11/2012 | Iwane | G02B 30/27 345/419 |
| 2013/0241907 | A1* | 9/2013 | Amirparviz | G09G 3/346 345/207 |
| 2014/0184655 | A1 | 7/2014 | Jang et al. | |
| 2015/0248210 | A1* | 9/2015 | Lee | H04N 21/4436 345/593 |
| 2015/0281573 | A1* | 10/2015 | Sasaki | H04N 5/772 348/231.99 |
| 2017/0078513 | A1* | 3/2017 | Chang | H04N 1/10 |
| 2017/0139250 | A1* | 5/2017 | Li | G02F 1/133528 |
| 2017/0139294 | A1* | 5/2017 | Kim | G02F 1/136286 |
| 2017/0142360 | A1* | 5/2017 | Goto | G02B 6/00 |
| 2017/0213496 | A1* | 7/2017 | Hsu | H01L 27/3213 |
| 2017/0289805 | A1* | 10/2017 | Hong | H04W 12/08 |
| 2018/0077371 | A1* | 3/2018 | Park | H04N 5/374 |
| 2018/0165533 | A1* | 6/2018 | Cho | G06F 3/042 |
| 2018/0190725 | A1* | 7/2018 | Lu | G09G 3/3648 |
| 2018/0196985 | A1* | 7/2018 | Ling | H01L 27/3246 |
| 2018/0211618 | A1* | 7/2018 | Wang | G06T 11/60 |
| 2019/0034686 | A1* | 1/2019 | Ling | G06K 9/00053 |
| 2019/0064515 | A1* | 2/2019 | Wei | G02F 1/133512 |
| 2019/0181184 | A1* | 6/2019 | Hu | H01L 51/5072 |
| 2019/0286869 | A1* | 9/2019 | Ling | H01L 27/3234 |
| 2020/0013833 | A1* | 1/2020 | Wang | G02F 1/1335 |
| 2020/0014858 | A1* | 1/2020 | Chesnokov | H04N 5/23212 |
| 2020/0167543 | A1* | 5/2020 | Wang | G06F 3/0412 |

FOREIGN PATENT DOCUMENTS

| | | |
|---|---|---|
| CN | 107222664 A | 9/2017 |
| CN | 107728361 A | 2/2018 |
| CN | 207338380 U | 5/2018 |
| CN | 109067942 A | 12/2018 |

OTHER PUBLICATIONS

International search report, PCT/CN2019/099104, dated Oct. 30, 2019.
European Patent Application No. 19189531.7, European search report, dated Jan. 24, 2020, 24 pages.
Chinese Patent Application No. 201810878085, First Office Action and it's English Translation, dated Feb. 28, 2020, 18 pages.
The second examination report for Chinese application 201810878085.1 dated Sep. 21, 2020.
First Examination Report dated Dec. 16, 2020 of India Patent Application No. 201914030921 (4 pages).
Notice of Allowance dated Dec. 28, 2020 of Chinese Patent Application No. 201810878085.1 (4 pages).

* cited by examiner

DISPLAY SCREEN AND ELECTRONIC DEVICE

CROSS-REFERENCE TO RELATED APPLICATION

This application claims priority to Chinese Patent Application No. 201810878085.1, filed on Aug. 3, 2018, the disclosure of which is hereby incorporated by reference in its entirety.

TECHNICAL FIELD

The present disclosure relates to the field of electronic technology, and more particularly to a display screen and an electronic device.

BACKGROUND

In related art, an image sensor is usually arranged on the top of a screen. Since the image sensor and the screen are separated component, the arrangement of the image sensor can occupy the area of the screen, so the proportion of the space for arranging the display screen in the electronic device is small and the screen-to-body ratio of the electronic device is low.

SUMMARY

In an aspect of the present disclosure, a display screen is provided. The display screen includes a number of display pixels arranged on a display area of the display screen and a number of image capturing pixels arranged in gaps between the number of display pixels, wherein the display screen is operable in a display mode or an image capturing mode, and wherein the display screen is configured to selectively activate the number of display pixels or the number of image capturing pixels based on which mode it operates in.

In another aspect of the present disclosure, an electronic device is provided. The electronic device includes a display screen. The display screen includes a number of display pixels arranged on a display area of the display screen and a number of image capturing pixels arranged in gaps between the number of display pixels, wherein the display screen is operable in a display mode or an image capturing mode; and a processor configured to selectively activate the number of display pixels or the number of image capturing pixels of the display screen based on a mode that the display screen operates in.

In yet another aspect of the present disclosure, an electronic device is provided. The electronic device includes a display screen. The display screen includes a number of display pixels in a display area and a number of image capturing pixels in a sub-area of the display area, wherein the sub-area is positioned in one or more gaps between the number of display pixels, and wherein the display screen is operable in a display mode or an image capturing mode; and a processor configured to control the display screen to operate in at least one of the display mode or the image capturing mode.

BRIEF DESCRIPTION OF THE DRAWINGS

The above and/or additional aspects of the present disclosure and the advantages of the present disclosure will become apparent and easily understood from the following description of the embodiments taken in conjunction with the accompanying drawings, in which.

Figure 1:
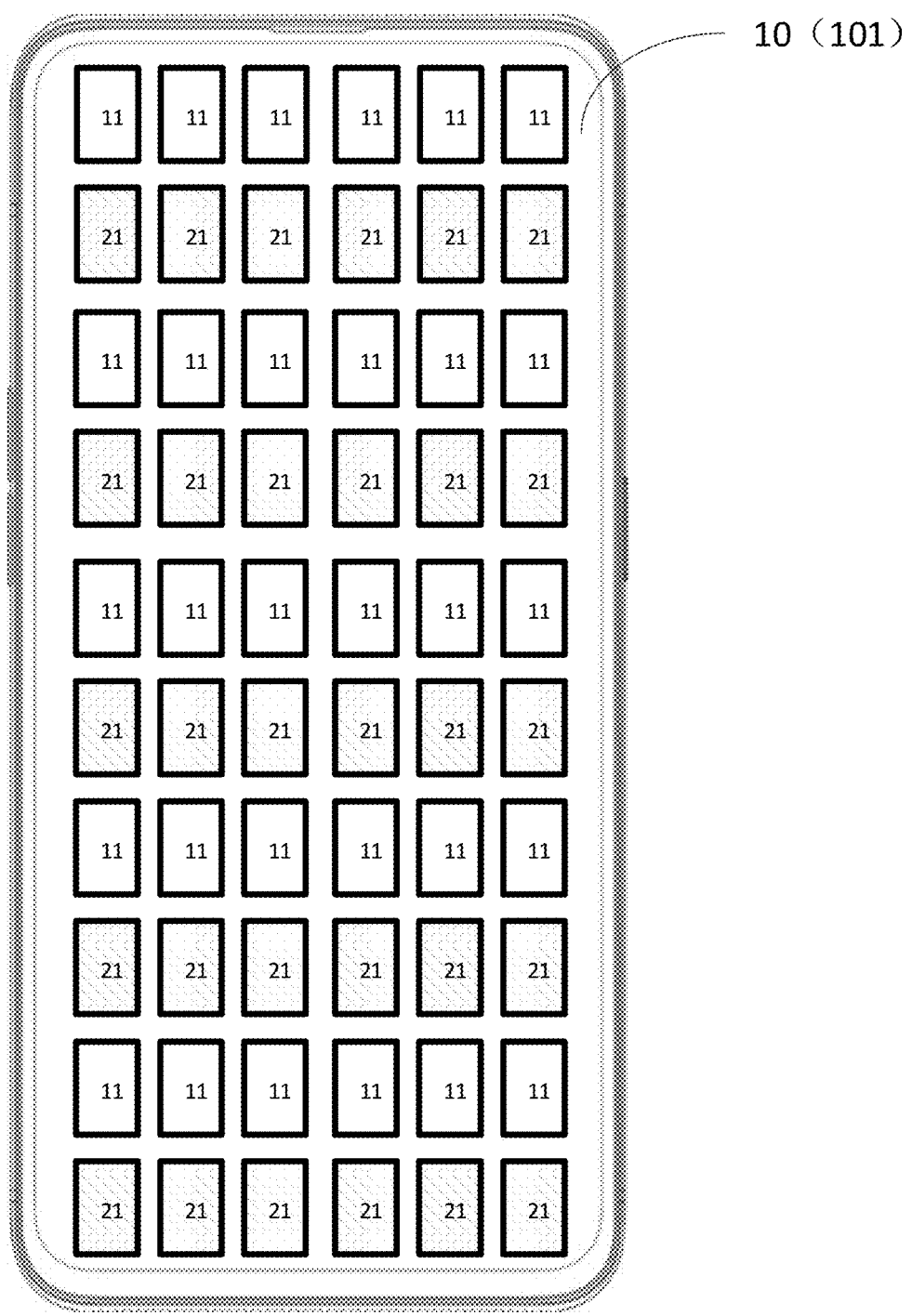
FIG. 1 is a structural schematic diagram of an electronic device according to one embodiment of the present disclosure.

REFERENCE NUMERALS FOR MAIN ELEMENTS display screen 10; display area 101; a sub-area 102 that can be used for image capturing; display pixel 11; sub-display pixel 111; image capturing pixel 21; sub-image capturing pixel 211; composite pixel 3; electronic device 100.

DETAILED DESCRIPTION

Embodiments of the present disclosure will be described in detail and examples of the embodiments will be illustrated in the accompanying drawing. The same or similar elements and the elements having same or similar functions are denoted by like reference numerals throughout the descriptions. The embodiments described herein with reference to the drawings are explanatory, which aim to illustrate the present disclosure, but shall not be construed to limit the present disclosure.

In an aspect of the present disclosure, a display screen is provided. The display screen includes a number of display pixels arranged on a display area of the display screen and a number of image capturing pixels arranged in gaps between the number of display pixels, wherein the display screen is operable in a display mode or an image capturing mode, and wherein the display screen is configured to selectively activate the number of display pixels or the number of image capturing pixels based on which mode it operates in.

In an embodiment, the number of image capturing pixels and the number of display pixels are operated in a mutually exclusive manner.

In an embodiment, each display pixel comprises at least three sub-display pixels.

In an embodiment, each sub-display pixel of each display pixel displays different color.

In an embodiment, each sub-display pixel of each display pixel displays a same color, and wherein all except one of the sub-display pixel of each display pixel are provided with one or more coating films or light filters such that a light color emitted by each sub-display pixel is different.

In an embodiment, each sub-display pixel of each display pixel displays a same color, and wherein each sub-display pixels is provided with a coating film or a light filter such that a light color emitted by each sub-display pixel is different.

In an embodiment, each image capturing pixel comprises at least three sub-image capturing pixels, and wherein each sub-image capturing pixel is used for collecting different color.

In an embodiment, each sub-image capturing pixel in each image capturing pixel is provided with a coating film or a light filter corresponding to the color to be collected by the sub-image capturing pixel.

In an embodiment, a number of display pixels and a number of image capturing pixels are arranged as an interleaved array in the display area.

In an embodiment, each display pixel comprises at least three sub-display pixels and each image capturing pixel comprises at least three sub-image capturing pixels, and wherein the at least three sub-display pixels and the at least three sub-image capturing pixels are arranged as an interleaved array in the display area.

In an embodiment, a display area of the display screen further includes a sub-area that is smaller than that of the display area, and wherein at least a subset of the number of display pixels and the number of image capturing pixels are arranged in an interleaved manner in the sub-area.

In an embodiment, each display pixel comprises at least three sub-display pixels and each image capturing pixel comprises at least three sub-image capturing pixels, and wherein the at least three sub-display pixels and the at least three sub-image capturing pixels are arranged in an interleaved manner in the sub-area.

In an embodiment, a display pixel of the number of display pixels and an image capturing pixel of the number of image capturing pixels are integrated into a composite pixel, the display pixel comprising at least three sub-display pixels, the image capturing pixel comprising at least three sub-image capturing pixels, and wherein the at least three sub-display pixels and the at least three sub-image capturing pixels are located in a different display row or display column in the composite pixel.

In another aspect of the present disclosure, an electronic device is provided. The electronic device includes a display screen. The display screen includes a number of display pixels arranged on a display area of the display screen and a number of image capturing pixels arranged in gaps between the number of display pixels, wherein the display screen is operable in a display mode or an image capturing mode; and a processor configured to selectively activate the number of display pixels or the number of image capturing pixels of the display screen based on a mode that the display screen operates in.

In an embodiment, the number of display pixels and the number of image capturing pixels are arranged on the entire display screen.

In an embodiment, the display area of the display screen 10 includes a sub-area that is smaller than the display area, and wherein the number of display pixels and the number of image capturing pixels are arranged in an interleaved manner in the sub-area.

In an embodiment, each display pixel comprises at least three sub-display pixels, and wherein each image capturing pixel comprises at least three sub-image capturing pixels each used for collecting a different color.

In yet another aspect of the present disclosure, an electronic device is provided. The electronic device includes a display screen. The display screen includes a number of display pixels in a display area and a number of image capturing pixels in a sub-area of the display area, wherein the sub-area is positioned in one or more gaps between the number of display pixels, and wherein the display screen is operable in a display mode or an image capturing mode; and a processor configured to control the display screen to operate in at least one of the display mode or the image capturing mode.

In an embodiment, wherein a number of image capturing pixels perform image capturing while a number of display pixels display an image.

In an embodiment, the display screen is configured to selectively activate the number of display pixels or the number of image capturing pixels based on which mode it operates in.

According to one aspect of the present disclosure, a display screen 10 will be described below with reference to FIGS. 1-6.

According to one embodiment of the present disclosure, the display screen 10 comprises a number of display pixels 11 and a number of image capturing pixels 21.

A number of display pixels 11 are tiled on the display area 101 of the whole display screen 10. A number of image capturing pixels 21 are arranged in gaps between a number of display pixels 11.

The display screen 10 can be in a display mode and an image capturing mode. When the display screen 10 is in a display mode, the display pixel 11 is switched on while the image capturing pixel 21 is switched off. When the display screen 10 is in an image capturing mode, the image capturing pixel 21 is switched on while the display pixel 11 is switched off.

According to an embodiment of the disclosure, the display pixel 11 and the image capturing pixel 21 are integrated into a display screen 10, so that the display screen support both display mode and image capturing mode. A camera and other structures used for image capturing may be omitted for electronic device with such display screen, for example, the front camera of the electronic device may be completely omitted. Therefore, the space on display screen that is occupied by the image capturing structure may be greatly reduced, thereby greatly improving the screen-to-body ratio of the electronic device.

According to one embodiment of the present disclosure, a display screen 10 will be described in detail below with reference to FIGS. 1-6.

In an embodiment of the present disclosure, each display pixel 11 includes at least three sub-display pixels 111.

Figure 2:
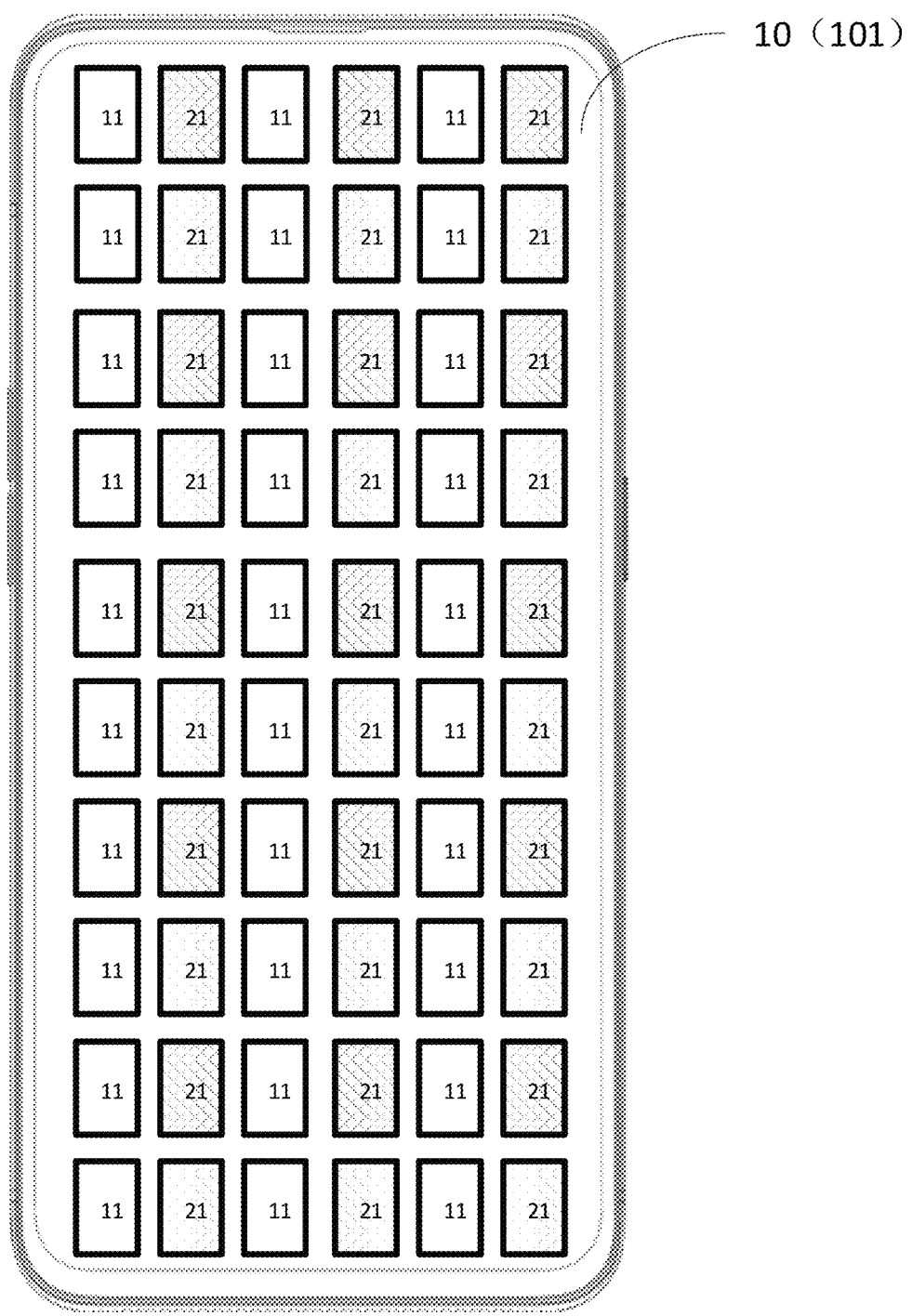
FIG. 2 is a structural schematic diagram of an electronic device according to one embodiment of the present disclosure.

In some embodiments of the present disclosure, referring to FIG. 2, each display pixel 11 includes three sub-display pixels 111. Optionally, the three sub-display pixels 111 may be a R1 sub-display pixel 111, a G1 sub-display pixel 111 and a B1 sub-display pixel 111. The R1 sub-display pixel 111 is a red sub-display pixel 111, the G1 sub-display pixel 111 is a green sub-display pixel 111 and the B1 sub-display pixel 111 is a blue sub-display pixel 111. The value of the three colors of the three sub-display pixels 111 is adjusted, so as to change the color and the brightness displayed by each pixel point. That is, in the present embodiment, the display screen 10 may use a RGB color standard.

Of course, the disclosure is not limited to this. In another embodiment of the present disclosure, each display pixel 11 includes four sub-display pixels 111 (not shown). Optionally, the four sub-display pixels 111 may be a R1 sub-display pixel 111, a G1 sub-display pixel 111, a B1 sub-display pixel 111 and a W1 sub-display pixel 111. The R1 sub-display pixel 111 is a red sub-display pixel 111, the G1 sub-display pixel 111 is a green sub-display pixel 111, the B1 sub-display pixel 111 is a blue sub-display pixel 111 and the W1 sub-display pixel 111 is a white sub-display pixel 111. The value of the four colors of the four sub-display pixels 111 is adjusted, so as to control the color and the brightness displayed by each pixel point. That is, in the present embodiment, the display screen 10 may use a RGBW color standard.

In addition, in another embodiment of the present disclosure, the four sub-display pixels 111 in the above example may be a C1 sub-display pixel 111, a M1 sub-display pixel 111, a Y1 sub-display pixel 111 and a K1 sub-display pixel 111. The C1 sub-display pixel 111 is a cyan sub-display pixel 111, the M1 sub-display pixel 111 is a magenta sub-display pixel 111, the Y1 sub-display pixel 111 is a yellow sub-display pixel 111 and the K1 sub-display pixel 111 is a black sub-display pixel 111. The value of the four colors of the four sub-display pixels 111 is adjusted, so as to adjust the color and the brightness displayed by each pixel point. That is, in the present embodiment, the display screen 10 may use a CMYK color standard.

In some embodiments of the present disclosure, each sub-display pixel 111 in each display pixel 11 may display different color.

For example, for each display pixel 11 with three sub-display pixels 111, each of the three sub-display pixel 111 may display different color. For example, in an RGB color standard, the R1 sub-display pixel 111 may be a sub-display pixel 111 capable of displaying red color, the G1 sub-display pixel 111 may be a sub-display pixel 111 capable of displaying green color, the B1 sub-display pixel 111 may be a sub-display pixel 111 capable of displaying blue color.

Of course, the present disclosure is not limited to this, each sub-display pixel 111 of each display pixel may display the same color. In some embodiments, except one of the sub-display pixel of each display pixel, the remaining sub-display pixels are provided with coating films or light filters respectively, so that the light color emitted by each sub-display pixel is different.

In some embodiments, in the RGB color standard, the R1 sub-display pixel 111, the G1 sub-display pixel 111 and the B1 sub-display pixel 111 may be sub-display pixels 111 with the same color. For example, the three sub-display pixels 111 may all be sub-display pixels 111 capable of displaying blue color. The R1 sub-display pixel 111 may be provided with a coating film or a light filter, so that the light emitted by the R1 sub-display pixel 111 is red, the G1 sub-display pixel 111 may be provided with a coating film or a light filter, so that the light emitted by the G1 sub-display pixel 111 is green.

In an embodiment, each sub-display pixel of each display pixel displays the same color. Each sub-display pixel is provided with a coating film or a light filter, so that the light color emitted by each sub-display pixel is different.

Of course, there are similar embodiments for a display screen 10 using a RGBW color standard and a CMYK color standard as described above, and is not described in detail herein.

In an embodiment of the present disclosure, each image capturing pixel 21 includes at least three sub-image capturing pixels 211. Each sub-image capturing pixel 211 is used for collecting a different color, and then the color value collected by the image capturing pixel 21 is obtained through calculation.

In some embodiments, each image capturing pixel 21 includes three sub-image capturing pixels 211. The three sub-image capturing pixels 211 may be a R2 sub-image capturing pixel 211, a G2 sub-image capturing pixel 211 and a B2 sub-image capturing pixel 211. The R2 sub-image capturing pixel 211 is used for collecting red color value, the G2 sub-image capturing pixel 211 is used for collecting green color value, the B2 sub-image capturing pixel 211 is used for collecting blue color value. The values of the three colors of the three sub-image capturing pixel 211 are collected to acquire the color and the brightness of each pixel point. That is, in the present embodiment, the image capturing pixel 21 may use a RGB color standard to collect image.

Of course, the present disclosure is not limited to this, in another embodiment of the present disclosure, each image capturing pixel 21 comprises four sub-image capturing pixels 211 (not shown), and the four sub-image capturing pixels 211 may be a R2 sub-image capturing pixel 211, a G2 sub-image capturing pixel 211, a B2 sub-image capturing pixel 211 and a W2 image capturing pixel 21. The R2 sub-image capturing pixel 211 is used for collecting red color value, the G2 sub-image capturing pixel 211 is used for collecting green color value, the B2 sub-image capturing pixel 211 is used for collecting blue color value and the W2 image capturing pixel 21 is used for collecting white color value. The value of the four colors of the four sub-image capturing pixel 211 is collected to acquire the color and the brightness of each pixel point. That is, in the present embodiment, the image capturing pixel 21 may use a RGBW color standard to collect image.

In addition, in another embodiment of the present disclosure, the four sub-image capturing pixels 211 may be a C2 sub-image capturing pixels 211, a M2 sub-image capturing pixel 211, a Y2 sub-image capturing pixel 211 and a K2 sub-image capturing pixel 211. The C2 sub-image capturing pixel 211 is a cyan sub-image capturing pixel 211, the M2 sub-image capturing pixel 211 is a magenta sub-image capturing pixel 211, the Y2 sub-image capturing pixel 211 is a yellow sub-image capturing pixel 211 and the K2 sub-image capturing pixel 211 is a black sub-image capturing pixel 211. The value of the four colors of the four sub-image capturing pixel 211 is collected to acquire the color and the brightness of each pixel point. That is, in the present embodiment, the image capturing pixel 21 may use a CMYK color standard to collect image.

In some embodiments of the present disclosure, each sub-image capturing pixel 211 of each image capturing pixel 21 is provided with a coating film or a light filter corresponding to the color to be collected by the image capturing pixel 211. Take the image capturing pixel 21 that uses a RGB color standard for image capturing as an example, the R2 sub-image capturing pixel 211 is provided with a red light filter which passes through the red wavelength, the G2 sub-image capturing pixel 211 is provided with a green light filter which passes through the green wavelength and the B2 sub-image capturing pixel 211 is provided with a blue light filter which passes through the blue wavelength. That is, the three sub-image capturing pixels 211 are provided with three light filters respectively.

Of course, the present disclosure is not limited to this, and the three sub-image capturing pixels 211 may also be provided with one light filter with different colors in different regions.

Of course, there are similar embodiments for a display screen 10 using a RGBW color standard and a CMYK color standard as described above, and is not described in detail herein.

In some embodiments of the present disclosure, referring to FIGS. 1-2, a number of display pixels 11 and a number of image capturing pixels 21 are arranged in a crossed manner in display area 101.

The "crossed manner" means that a number of display pixels 11 and a number of image capturing pixels 21 are arranged in an interleaved manner in the display area 101. In some embodiments, one or more display pixels 11 and the image capturing pixels 21 may be arranged in a crossed manner in the display row in the display area 101 (e.g., as shown in FIG. 2). For example, one or more image capturing pixels 21 may be arranged between every two adjacent display pixels 11 in the same display row. Similarly, one or more display pixels 11 may be arranged between every two adjacent image capturing pixels 21 in the same display row. In some embodiments, one or more display pixels 11 and the image capturing pixels 21 may be arranged in a crossed manner in the display column (e.g., as shown in FIG. 1). For example, one or more image capturing pixels 21 may be arranged between every two adjacent display pixels 11 in the same display column. Similarly, one or more display pixels 11 may be arranged between every two adjacent image capturing pixels 21 on the same display column.

In some embodiments of the present disclosure, a number of display pixels 11 and a number of image capturing pixels 21 may be arranged in any arrangement and combination manner within the display area 101.

In some embodiments of the present disclosure, each display pixel 11 includes at least three sub-display pixels 111 and each image capturing pixel 21 includes at least three sub-image capturing pixels 211. A number of sub-display pixels 111 and a number of sub-image capturing pixels 211 are arranged in a crossed manner in the display area 101 (e.g., as shown in FIG. 3).

The "crossed manner" means that a number of sub-display pixels 111 and a number of sub-image capturing pixels 211 are arranged as an interleaved array in the display area 101. In some embodiments, one or more sub-display pixels 111 and the sub-image capturing pixels 211 may be arranged in a crossed manner in the display row. For example, one or more sub-image capturing pixels 211 may be arranged between every two adjacent sub-display pixels 111 in the same display row. Similarly, one or more sub-display pixels 111 may be arranged between every two adjacent sub-image capturing pixels 211 in the same display row. In some embodiments, one or more sub-display pixels 111 and the sub-image capturing pixels 211 may be arranged in a crossed manner in the display column. For example, one or more sub-image capturing pixels 211 may be arranged between every two adjacent sub-display pixels 111 in the same display column. Similarly, one or more sub-display pixels 111 may be arranged between every two adjacent sub-image capturing pixels 211 in the same display column.

Thus, a number of display pixels 11 and a number of image capturing pixels 21 are arranged on the entire display screen 10, so that the whole display screen 10 can display normally and has an image capturing function. Therefore, the area of the image capturing area is the same area as the display screen 10, thereby achieving a large image capturing area.

Figure 3:
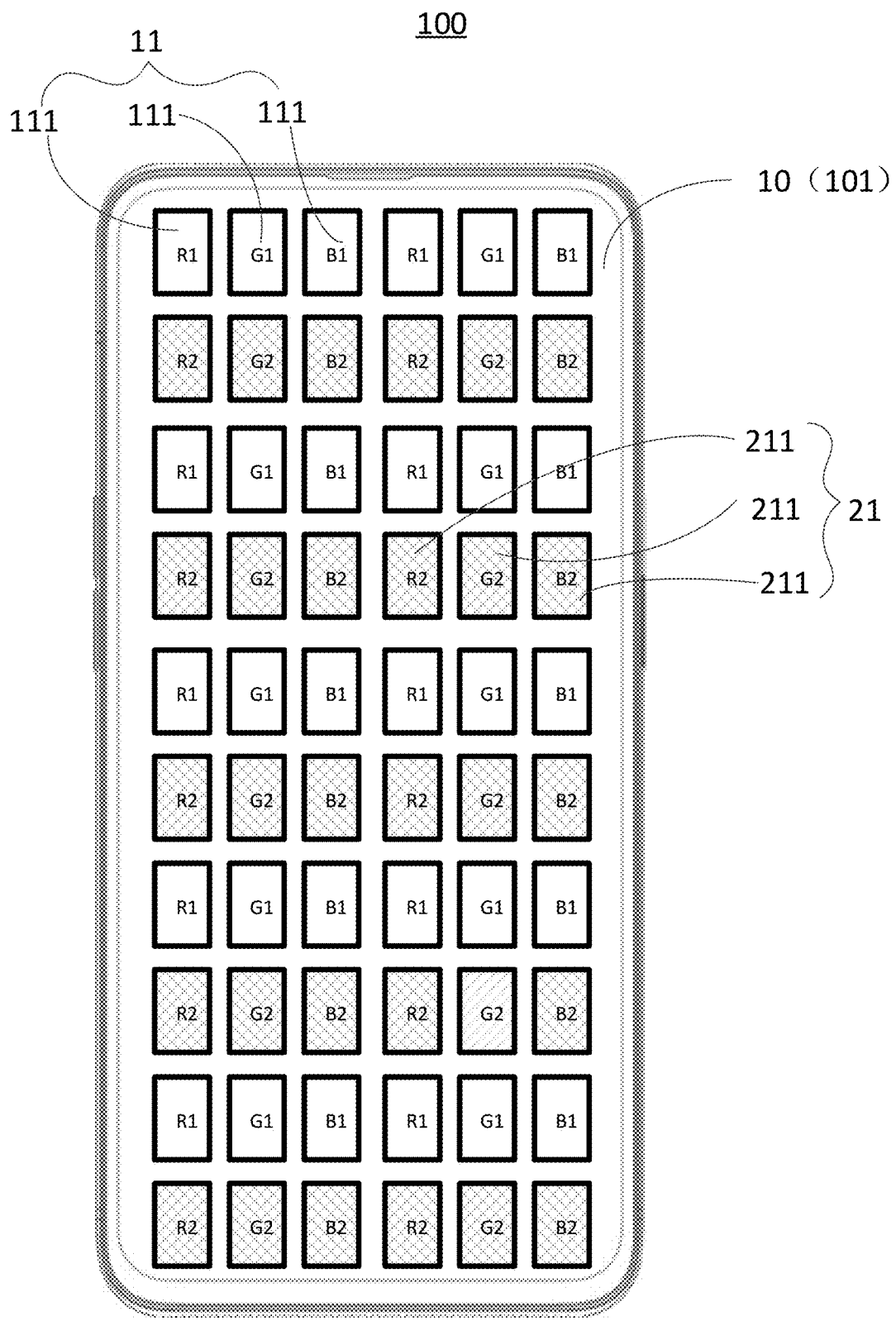
FIG. 3 is a structural schematic diagram of an electronic device according to another embodiment of the present disclosure.
Figure 4:
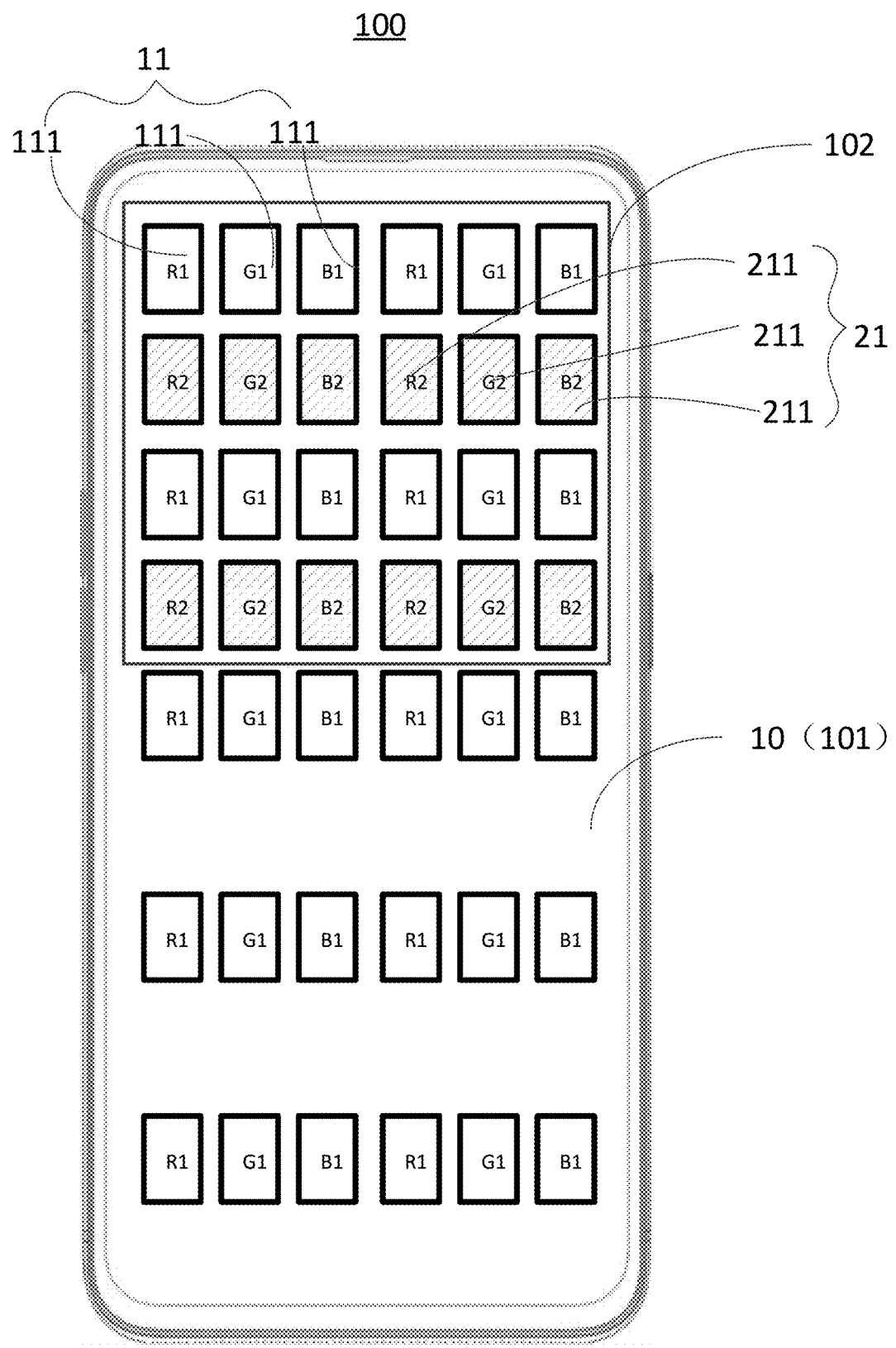
FIG. 4 is a structural schematic diagram of an electronic device according to yet another embodiment of the disclosure.

In some embodiments of the present disclosure, referring to FIGS. 3-4, the display area 101 of the display screen 10 includes an sub-area 102 that is smaller than that of the display area 101. A number of image capturing pixels 21 are arranged in the sub-area 102 and a number of display pixels 11 and a number of image capturing pixels 21 arranged in a crossed manner in the sub-area 102.

In some embodiments of the present disclosure, a number of display pixels 11 are arranged as an array in the display area 101, and a number of image capturing pixels 21 are arranged as an array in the sub-area 102 (also referred to as the image capturing area here), which is located in one or more gaps among the display pixels 11. In some embodiments, as shown in FIG. 4, a number of display pixels 11 and a number of image capturing pixels 21 are arranged in a crossed manner in the sub-area 102.

The "crossed manner" means that a number of display pixels 11 and a number of image capturing pixels 21 are arranged an interleaved manner in the sub-area 102. In some embodiments, one or more display pixels 11 and one or more image capturing pixels 21 may be arranged in a crossed manner in the display row in the sub-area 102 (e.g., as shown in FIG. 4). For example, one or more image capturing pixels 21 may be arranged between every two adjacent display pixels 11 in the same display row. Similarly, one or more display pixels 11 may be arranged between every two adjacent image capturing pixels 21 in the same display row. In some embodiments, one or more display pixels 11 and the image capturing pixels 21 may be arranged in a crossed manner in the display column. For example, one or more image capturing pixels 21 may be arranged between every two adjacent display pixels 11 in the same display column. Similarly, one or more display pixels 11 may be arranged between every two adjacent image capturing pixels 21 in the same display column.

In some embodiments of the present disclosure, each display pixel 11 includes at least three sub-display pixels 111 and each image capturing pixel 21 includes at least three sub-image capturing pixels 211. A number of sub-display pixels 111 and a number of sub-image capturing pixels 211 are arranged in a crossed manner in the sub-area 102.

The "cross manner" means that a number of sub-display pixels 111 and a number of sub-image capturing pixels 211 are arranged as an interleaved array. In some embodiments, one or more sub-display pixels 111 and one or more sub-image capturing pixels 211 may be arranged in a crossed manner in the display row. For example, one or more sub-image capturing pixels 211 may be arranged between every two adjacent sub-display pixels 111 in the same display row. Similarly, one or more sub-display pixels 111 may be arranged between every two adjacent sub-image capturing pixels 211 in the same display row. In some embodiments, one or more sub-display pixels 111 and the sub-image capturing pixels 211 may be arranged in a crossed manner in the display column. For example, one or more sub-image capturing pixels 211 may be arranged between every two adjacent sub-display pixels 111 in the same display column. Similarly, one or more sub-display pixels 111 may be arranged between every two adjacent sub-image capturing pixels 211 in the same display column.

Thus, a sub-area 102 within the display area 101 is provided on the display screen 10 and may be used for image capturing. Therefore, the number of the image capturing pixels 21 may be reduced and the cost may be reduced. In addition, when the image capturing pixel 21 performs image capturing function, the rest of the display screen 10 may also normally display, so that the capturing of the image and the display of the screen are not obstructed. Therefore, the user experience may be improved.

Of course, the present disclosure is not limited to this. A number of sub-areas 102 may be arranged on the display screen 10, for example, there may be two or more sub-areas 102 for imaging capturing.

Figure 5:
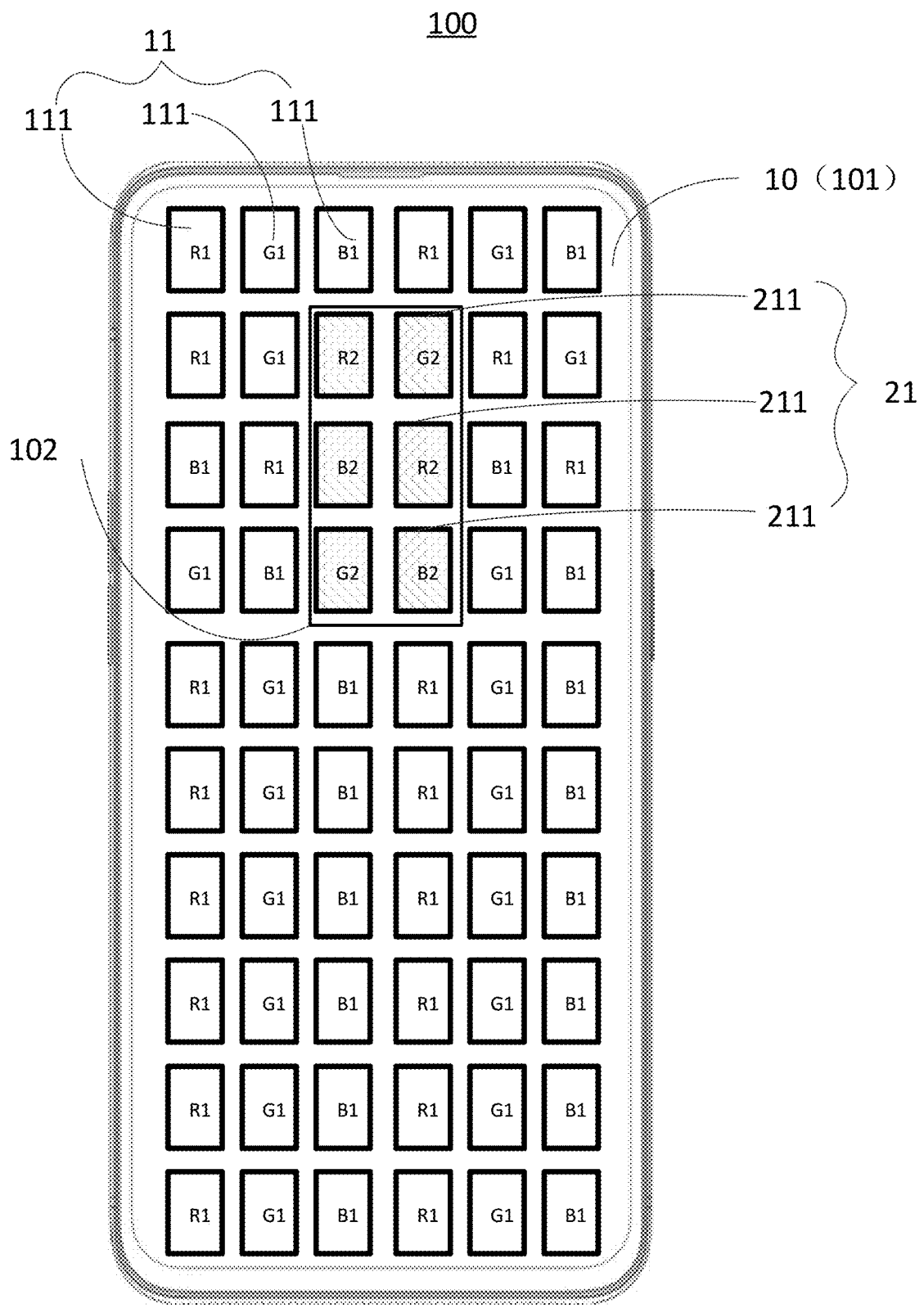
FIG. 5 is a structural schematic diagram of an electronic device according to additional embodiment of the disclosure.

In one embodiment of the disclosure, referring to FIG. 5, an electronic device includes a display screen. The display screen includes a number of display pixels in a display area and a number of image capturing pixels in an image capturing area. The image capturing area is arranged in a gap between a number of display pixels. The display screen can operate in a display mode or an image capturing mode.

In one embodiment, the image capturing area and the display area are two independent area.

Figure 6:
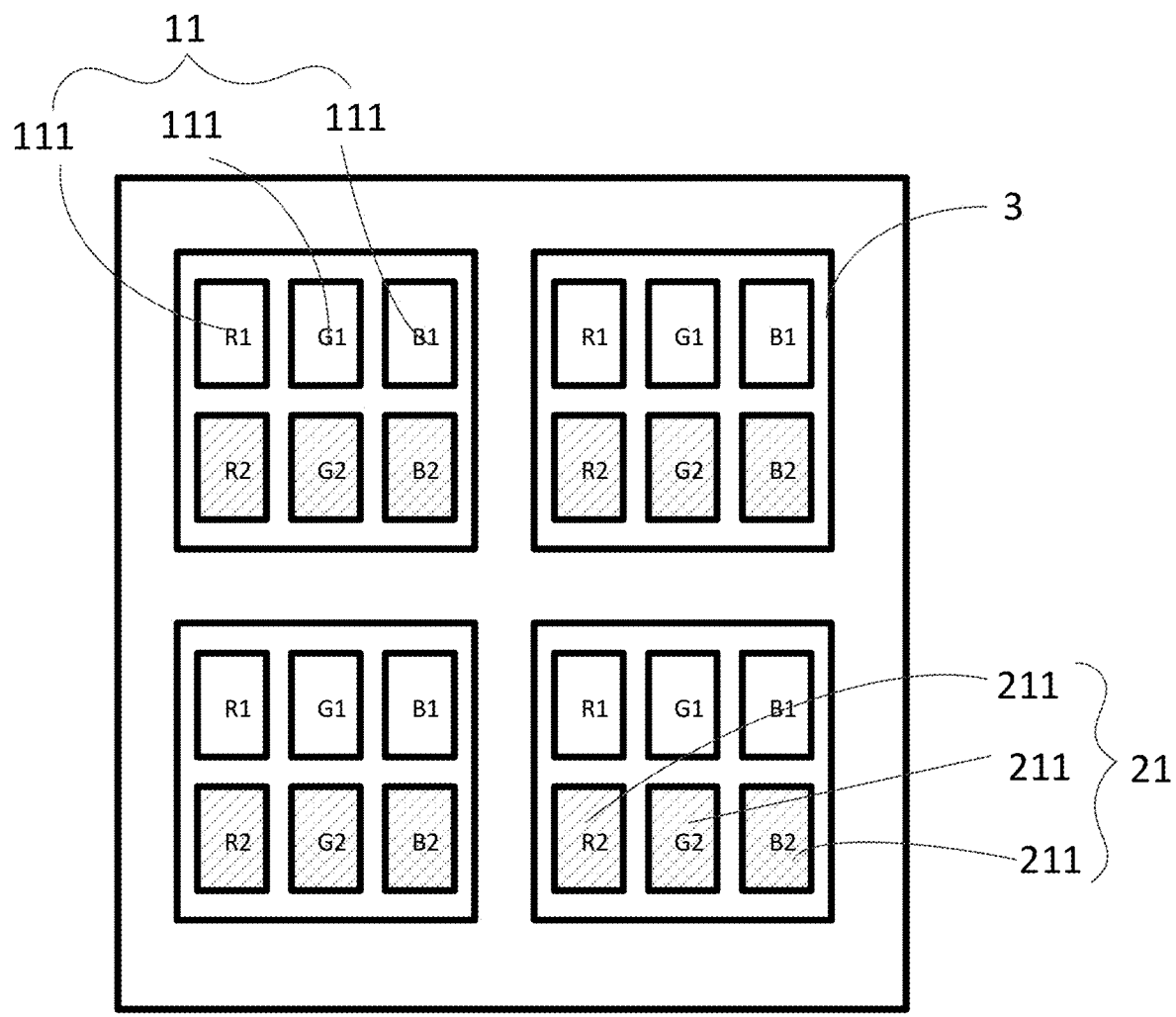
FIG. 6 is a structural schematic diagram of a display screen or a local structure diagram of a display screen according to one embodiment of the disclosure.
Figure 7:
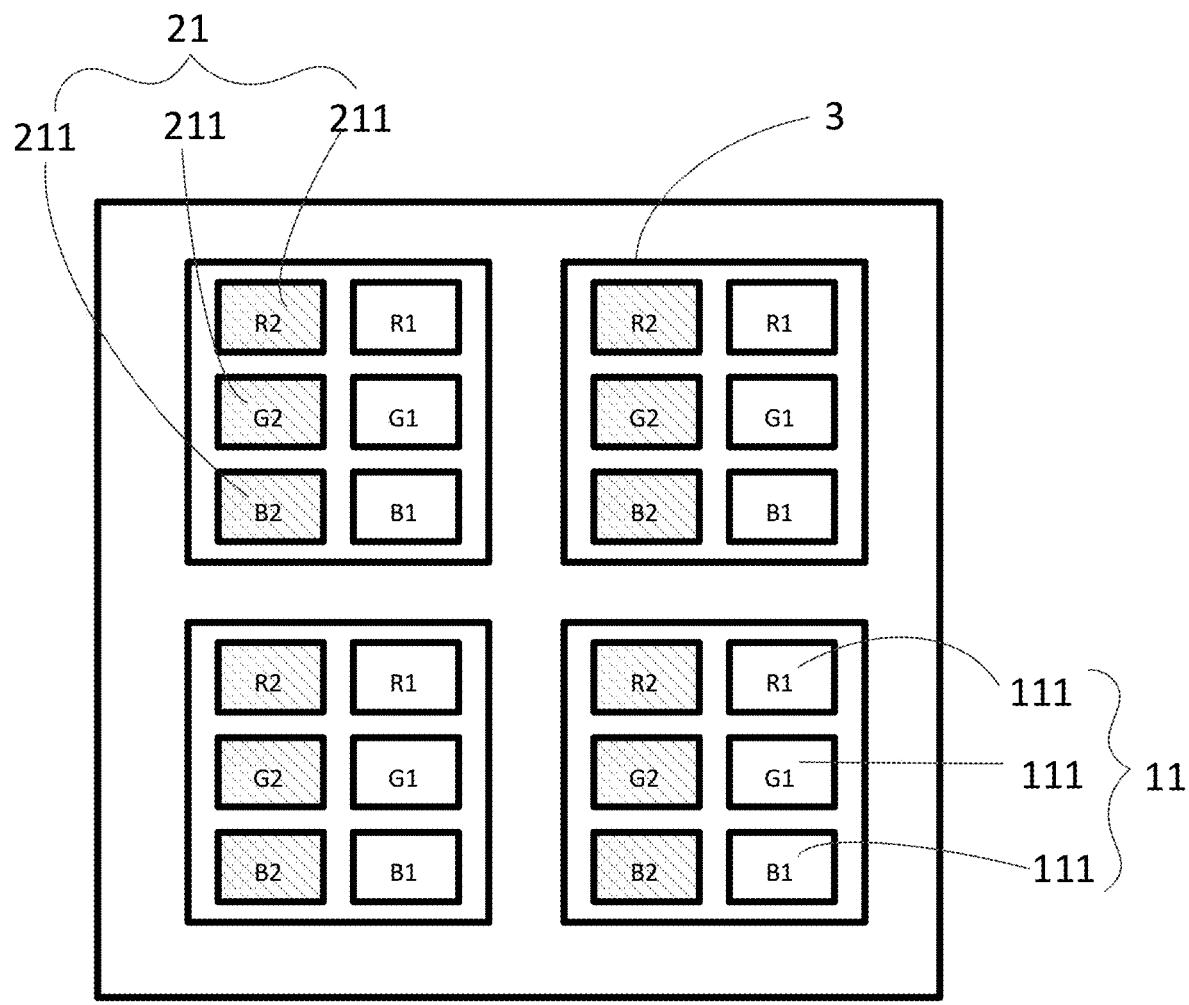
FIG. 7 is a structural schematic diagram of a display screen or a local structure diagram of a display screen according to another embodiment of the disclosure.

In one embodiment of the disclosure, referring to FIGS. 6-7, a display pixel of the plurality of display pixels 11 and an image capturing pixel of image capturing pixel 21 are integrated into a composite pixel 3. The display pixel 11 includes at least three sub-display pixels 111 and the image capturing pixel 21 includes at least three sub-image capturing pixels 211. In the composite pixel 3, the sub-display pixels 111 and the sub-image capturing pixels 21 are located in different display row or display column. A display pixel 11 and an image capturing pixel 21 are integrated into a composite pixel 3, so that the integration level of the chip may be improved. The arrangement of the pixel 11 and the image capturing pixel 21 may be conveniently design, the manufacturing difficulty is reduced while the efficiency is improved.

It should be noted that the display screen may be a MicroLED (micro light emitting diode) and a micro-image capturing pixel is simultaneously implanted into the screen, so that a novel screen integrating display and image capturing is achieved. For a MicroLED display having display pixels, when the MicroLED are micro-scaled to form gaps between the display pixels, the image capturing pixels may be arranged in the gaps. The image capturing pixels may be arranged in a certain area of the screen and may form an array, the display screen is operable in a display mode (through the MicroLED sub-pixels) and/or an image capturing mode (photographing/videotaping through image capturing pixels).

In one embodiment of the disclosure, an electronic device 100 comprises the above mentioned display screen 10 and a processor. The processor configured to control the display screen to operate in at least one of the display mode or the image capturing mode.

The electronic device 100 according to the embodiment of the present disclosure is provided with the display screen 10, so a camera and other structures used for image capturing may be omitted. For example, the front camera of the electronic device 100 may be completely omitted. Therefore, the space on display screen that is occupied by the image capturing structure may be greatly reduced, thereby greatly improving the screen-to-body ratio of the electronic device.

In one embodiment of the present application, referring to FIGS. 1-7, the electronic device 100 is a mobile phone. Further, the mobile phone may further comprise a radio frequency circuit, a memory, an input unit, a wireless fidelity (WIFI) module, a sensor, an audio circuit, a processor, a power supply and the like.

The radio frequency circuit may be used for receiving and transmitting signals during receiving and sending information or communication. Particularly, the radio frequency circuit receives the downlink information of the base station for the processor to process and sends uplink data of the mobile phone to the base station. Generally, the RF circuit includes, but is not limited to, an antenna, at least one amplifier, a coupler, a low-noise amplifier, a duplexer and the like. In addition, the radio frequency circuit may be in communication with the network and other devices through wireless communication. The wireless communication may use any communication standard or protocol includes, but is not limited to, a global system for mobile communication (GSM), general packet radio service (GPRS), code division multiple access (CDMA), wideband code division multiple access (WCDMA), long term evolution (LTE), e-mail, short messaging service (SMS) and the like.

The memory may be used for storing a software program and a module. The processor is used for executing the software program stored in the memory and the module, so that various functional applications and data processing of the mobile phone are carried out. The memory may mainly include a storage program area and a storage data area, wherein the storage program area may store an operating system, at least one application program for function (such as a sound playing function, an image playing function and the like). The storage data area may store data (such as audio data, telephone book and the like) created according to the use of the mobile phone. In addition, the memory may include a high-speed random access memory and may also include a non-volatile memory, such as at least one magnetic disk storage device, a flash memory device or other volatile solid state memory devices.

The input unit may be used for receiving input digital or character information and generating key signals related to user setting and function control of the mobile phone. Specifically, the input unit may include a touch panel and other input devices. The touch panel, also referred to as a touch screen, may collect a touch operation (such as a user uses fingers, touch pen and other suitable objects or accessories on the touch panel or in the vicinity of the touch panel) and drive the corresponding connecting device according to a preset program. Optionally, the touch panel may include a touch detection device and a touch controller. The touch detection device detects the touch orientation of a user and detects a signal brought by the touch operation and transmits the signal to the touch controller. The touch controller receives touch information from the touch detection device, converts the touch information into contact coordinates, sends to the processor, receives a command sent by the processor and executing the command. In addition, a touch panel may be resistance-type touch panel, capacitive-type touch panel, infrared-type touch panel, surface-sound-waves-type touch panel and the like. In addition to the touch panel, the input unit may also include other input devices. Specifically, other input devices may include, but is not limited to, a physical keyboard, a function key (such as a volume control key, a switch button and the like)), a trackball, a mouse, an operating rod and the like.

In some embodiments of the present disclosure, the mobile phone may also include an attitude sensor, a light sensor and other sensors.

Specifically, the gesture sensor may refer to a motion sensor and may be one of the motion sensors as a gravity sensor. The gravity sensor is made of cantilever displacement device with elastic sensitive element. An electric contact is driven by an energy storage spring made of an elastic sensitive element, so that the change of the gravity into an electric signal may be realized.

The accelerometer sensor may be enumerated as the other one of the motion sensors. The accelerometer sensor may detect the acceleration in all directions (generally three axes), may detect the gravity and the direction during the static state. It may be used for identifying the application of a mobile phone through the state of the mobile phone and it may having vibration identification functions (such as pedometer, knocking) and the like.

In one embodiment of the disclosure, a sensor may contains a pressure gauge, a hygrometer, a thermometer, an infrared sensor and the like.

The light sensor may include an ambient light sensor and a proximity sensor. The ambient light sensor may adjust the brightness of the display screen according to the brightness of ambient light and the proximity sensor. The display screen may be switched off according to the proximity sensor when the mobile phone is moved to the ear.

The audio circuit, the loudspeaker and the microphone may provide an audio interface between the user and the mobile phone. The audio circuit may convert the received audio data into electrical signals and transmit it to a loudspeaker. The loudspeaker convert the electrical signals into a sound signal and output the sound signal. On the other hand, the microphone is used for converting the collected sound signal into an electric signal and the audio circuit receives the electric signal and converts it into audio data. Then the audio data is outputted to a processor to process and transmitted to the other mobile phone via the radio frequency circuit, or the audio data is outputted to the memory for further processing.

The processor is a control center of the electronic device 100. The processor is installed on the circuit board assembly, and connects all parts of the whole electronic device 100 through various interfaces and circuits. The processor monitor the electronic device by running or executing the software programs and/or modules stored in the memory, calling the data stored in the memory, processing data and executing function of the electronic device 100. Alternatively, the processor may include one or more processing units. Alternatively, the processor may be integrated with an application processor and a modulation and demodulation processor. The application processor is mainly used for processing an operating system, a user interface, an application program and the like, while the modulation and demodulation processor is mainly used for processing wireless communication.

The power supply may be logically connected with the processor through the power management system, so that the functions of management, charging, discharging, power consumption management and the like are realized through the power management system. Although not shown, the electronic device 100 may also include a Bluetooth module, a sensor (such as a gesture sensor, a light sensor, a barometer, a hygrometer, a thermometer, an infrared sensor and the like).

It is to be understood that the mobile phone is only one example of the electronic device 100, and the present application is not limited to it. For example, the electronic device 100 may also be a personal computer and the like.

In the description of the specification, reference is made to the term "one embodiment", "some embodiments" or "for example" and the like are intended to refer to specific feature, structure, material or characteristic included in at least one embodiment or example of the present disclosure. In the specification, the schematic expression of the above terms does not necessarily refer to the same embodiment or example. Moreover, the specific feature, structure, material or characteristic may be combined in any suitable manner in any one or more embodiments or examples.

While the embodiments of the disclosure have been shown and described, it will be understood by those of ordinary skill in the art that various changes or modifications may be made to these embodiments without departing from the principles and purposes of the present disclosure. The scope of the disclosure is defined by the claims and their equivalents.

What is claimed is:

1. A display screen, comprising:
a plurality of display pixels arranged on a display area of the display screen; and
a plurality of image capturing pixels arranged in gaps between the plurality of display pixels, wherein the display screen is operable in a display mode or an image capturing mode, and wherein the display screen is configured to selectively activate the plurality of display pixels or the plurality of image capturing pixels based on which mode it operates in,
wherein the display area of the display screen further includes a sub-area smaller than the display area,
wherein a subset of the plurality of display pixels and the plurality of image capturing pixels are arranged in an interleaved manner in the sub-area, and
wherein the plurality of image capturing pixels are only in the sub-area, rather than in an area of the display area other than the sub-area.

2. The display screen according to claim 1, wherein the plurality of image capturing pixels and the plurality of display pixels are operated in a mutually exclusive manner.

3. The display screen according to claim 1, wherein each display pixel comprises at least three sub-display pixels.

4. The display screen according to claim 3, wherein each sub-display pixel of each display pixel displays different color.

5. The display screen according to claim 3, wherein each sub-display pixel of each display pixel emits light of a same color, and wherein all except one of the sub-display pixel of each display pixel are provided with one or more coating films or light filters such that theft light color emitted by each sub-display pixel changes to a different light color.

6. The display screen according to claim 3, wherein each sub-display pixel of each display pixel emits light of a same color, and wherein each sub-display pixels is provided with a coating film or a light filter such that the light color emitted by each sub-display pixel changes to a different light color.

7. The display screen according to claim 1, wherein each image capturing pixel comprises at least three sub-image capturing pixels, and wherein each sub-image capturing pixel is used for collecting different color.

8. The display screen according to claim 7, wherein each sub-image capturing pixel in each image capturing pixel is provided with a coating film or a light filter corresponding to the color to be collected by the sub-image capturing pixel.

9. The display screen according to claim 1, wherein the plurality of display pixels and the plurality of image capturing pixels are arranged as an interleaved array in the display area.

10. The display screen according to claim 9, wherein each display pixel comprises at least three sub-display pixels and each image capturing pixel comprises at least three sub-image capturing pixels, and wherein the at least three sub-display pixels and the at least three sub-image capturing pixels are arranged as an interleaved array in the display area.

11. The display screen according to claim 1, wherein each display pixel comprises at least three sub-display pixels and each image capturing pixel comprises at least three sub-image capturing pixels,
and wherein the at least three sub-display pixels and the at least three sub-image capturing pixels are arranged in an interleaved manner in the sub-area.

12. The display screen according to claim 1, wherein a display pixel of the plurality of display pixels and an image capturing pixel of the plurality of image capturing pixels are integrated into a composite pixel, the display pixel comprising at least three sub-display pixels, the image capturing pixel comprising at least three sub-image capturing pixels, and wherein the at least three sub-display pixels and the at least three sub-image capturing pixels are located in a different display row or display column in the composite pixel.

13. An electronic device, comprising:
a display screen that includes:
a plurality of display pixels arranged on a display area of the display screen; and
a plurality of image capturing pixels arranged in gaps between the plurality of display pixels,
wherein the display screen is operable in a display mode or an image capturing mode; and
circuitry coupled to the display screen configured to selectively activate the plurality of display pixels or the plurality of image capturing pixels of the display screen based on a mode that the display screen operates in,
wherein the display area of the display screen further includes a sub-area smaller than the display area,
wherein a subset of the plurality of display pixels and the plurality of image capturing pixels are arranged in an interleaved manner in the sub-area, and
wherein the plurality of image capturing pixels are only in the sub-area, rather than in an area of the display area other than the sub-area.

14. An electronic device according to claim 13, wherein the plurality of display pixels and the plurality of image capturing pixels are arranged on the entire display screen.

15. An electronic device according to claim 13, wherein each display pixel comprises at least three sub-display pixels, and wherein each image capturing pixel comprises at least three sub-image capturing pixels each used for collecting a different color.

16. An electronic device, comprising:
a display screen that includes:
a plurality of display pixels in a display area; and
a plurality of image capturing pixels in a sub-area of the display area,
wherein the sub-area is positioned in one or more gaps between the plurality of display pixels, and wherein the display screen is operable in a display mode or an image capturing mode and wherein the plurality of image capturing pixels are only in the sub-area, rather than in an area of the display area other than the sub-area; and
a processor configured to control the display screen to operate in at least one of the display mode or the image capturing mode.

17. An electronic device according to claim 16, wherein the plurality of image capturing pixels perform image capturing while the plurality of display pixels display an image.

18. An electronic device according to claim 16, wherein the display screen is configured to selectively activate the plurality of display pixels or the plurality of image capturing pixels based on which mode it operates in.

* * * * *